US009404179B2

(12) United States Patent
Nelson et al.

(10) Patent No.: US 9,404,179 B2
(45) Date of Patent: Aug. 2, 2016

(54) CHEMICAL VAPOR DEPOSITION PROCESS FOR DEPOSITING A SILICA COATING ON A GLASS SUBSTRATE

(71) Applicant: PILKINGTON GROUP LIMITED, Lathom (GB)

(72) Inventors: Douglas Martin Nelson, Curtice, OH (US); Michael Martin Radtke, Peru, IL (US); Steven Edward Phillips, Ottawa, IL (US)

(73) Assignee: PILKINGTON GROUP LIMITED, Lathom (GB)

( * ) Notice: Subject to any disclaimer, the term of this patent is extended or adjusted under 35 U.S.C. 154(b) by 0 days.

(21) Appl. No.: 13/261,943

(22) PCT Filed: Feb. 18, 2013

(86) PCT No.: PCT/GB2013/050383
§ 371 (c)(1),
(2) Date: Aug. 20, 2014

(87) PCT Pub. No.: WO2013/124634
PCT Pub. Date: Aug. 29, 2013

(65) Prior Publication Data
US 2015/0140216 A1    May 21, 2015

Related U.S. Application Data

(60) Provisional application No. 61/602,354, filed on Feb. 23, 2012.

(51) Int. Cl.
*C23C 16/00* (2006.01)
*C23C 16/24* (2006.01)
(Continued)

(52) U.S. Cl.
CPC ............ *C23C 16/455* (2013.01); *C03C 17/245* (2013.01); *C03C 17/3417* (2013.01); *C23C 16/401* (2013.01); *C23C 16/42* (2013.01); *C03C 2217/213* (2013.01); *C03C 2217/241* (2013.01); *C03C 2218/1525* (2013.01)

(58) Field of Classification Search
CPC .... C23C 16/455; C23C 16/42; C23C 16/401; C03C 17/3417; C03C 17/245; C03C 2218/1525; C03C 2217/241; C03C 2217/213
USPC .......................... 427/162–169, 248.1–255.7
See application file for complete search history.

(56) References Cited

U.S. PATENT DOCUMENTS 4,837,048 A * 6/1989 Ishihara et al. ................. 427/69
4,922,853 A   5/1990 Hofer
(Continued)

OTHER PUBLICATIONS http://www.concoa.com/acetylene_properties.html, CONCOA—Acetylene Properties, accessed online May 8, 2015.*
(Continued)

*Primary Examiner* — Michael Wieczorek
*Assistant Examiner* — Michael G Miller
(74) *Attorney, Agent, or Firm* — Marshall & Melhorn, LLC

(57) ABSTRACT

A CVD process for depositing a silica coating is provided. The process includes providing a glass substrate. The process also includes forming a gaseous mixture including a silane compound, oxygen, a fluorine-containing compound, and a radical scavenger such as ethylene or propylene. The gaseous mixture is directed toward and along the glass substrate and is reacted over the glass substrate to form the silica coating thereon.

21 Claims, 1 Drawing Sheet

(51) Int. Cl.
*B05D 5/06* (2006.01)
*C23C 16/455* (2006.01)
*C23C 16/40* (2006.01)
*C23C 16/42* (2006.01)
*C03C 17/245* (2006.01)
*C03C 17/34* (2006.01)

(56) References Cited

U.S. PATENT DOCUMENTS

| | | | | |
|---|---|---|---|---|
| 5,356,718 | A | * | 10/1994 | Athey et al. ............... 428/428 |
| 5,599,387 | A | * | 2/1997 | Neuman ............... C03C 17/002 106/287.14 |
| 5,798,142 | A | | 8/1998 | Soubeyrand |
| 5,935,649 | A | * | 8/1999 | Koizumi et al. ............... 438/556 |
| 2004/0175500 | A1 | * | 9/2004 | Fujisawa et al. ......... 427/255.28 |
| 2012/0240627 | A1 | | 9/2012 | Nelson et al. |

OTHER PUBLICATIONS http://www.concoa.com/silane_properties.html, CONCOA Silane Properties, accessed online May 8, 2015.*
http://periodictable.com/Properties/A/AtomicWeight.al.html, Element Atomic Weight, accessed online May 8, 2015.*
http://periodictable.com/Properties/A/Density.al.html, Element Density, accessed online May 8, 2015.*

* cited by examiner

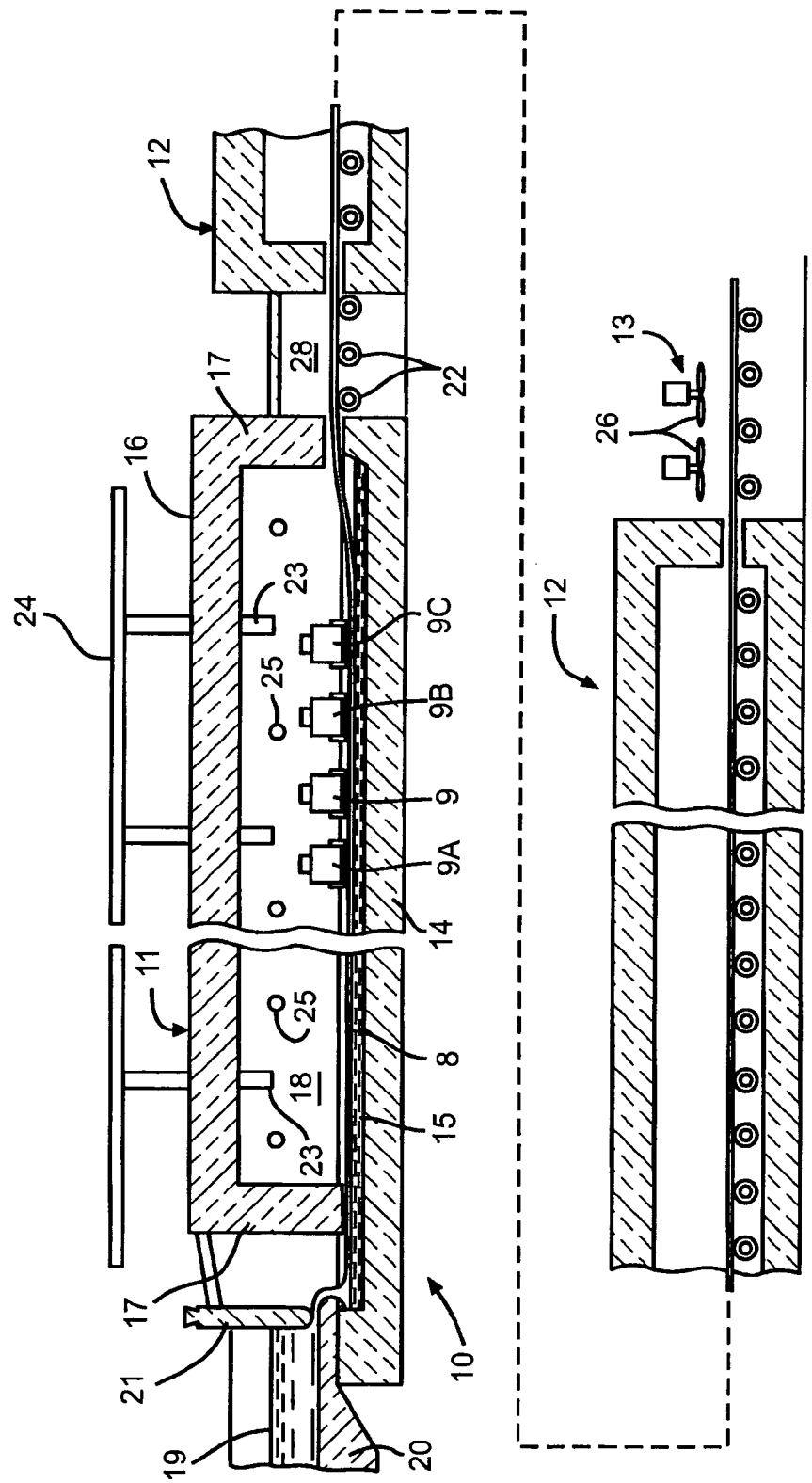

CHEMICAL VAPOR DEPOSITION PROCESS FOR DEPOSITING A SILICA COATING ON A GLASS SUBSTRATE

CROSS-REFERENCE TO RELATED APPLICATION

This application is claiming the benefit, under 35 U.S.C. 119(e), of the provisional application which was granted Ser. No. 61/602,354 filed on Feb. 23, 2012, the entire disclosure of which is hereby incorporated by reference.

BACKGROUND OF THE INVENTION

This invention relates in general to a chemical vapor deposition (CVD) process for producing a coated glass article and the coated glass article formed thereby. In particular, this invention relates to a CVD process for forming a silica coating over a glass substrate and a glass article having a silica coating formed thereon.

Silica coatings are known to be deposited on glass substrates. However, the processes known for the production of the silica coatings are limited by the efficiency of the deposition process and/or by powder formation (pre-reaction) of the reactive elements. Therefore, it is desired to devise an improved process for the formation of a silica coating over a glass substrate.

BRIEF SUMMARY OF THE INVENTION

In an embodiment, a CVD process for depositing a silica coating is provided. The CVD process comprises providing a glass substrate and forming a gaseous mixture. In certain embodiments, the gaseous mixture comprises a silane compound, oxygen, a fluorine-containing compound, and a radical scavenger. In other embodiments, the gaseous mixture comprises a silane compound, oxygen, hydrogen fluoride, and a radical scavenger. In these embodiments, the CVD process also comprises directing the gaseous mixture toward and along the glass substrate, and reacting the mixture over the glass substrate to form a silica coating thereon.

In another embodiment, the CVD process for depositing the silica coating comprises providing a moving glass substrate. The glass substrate has a surface upon which the silica coating is to be deposited over. The surface is at essentially atmospheric pressure. In this embodiment, a silane compound, oxygen, hydrogen fluoride and a radical scavenger is mixed to form a gaseous mixture and the gaseous mixture is fed through a coating apparatus. The gaseous mixture is discharged from the coating apparatus and is directed toward and along the surface of the glass substrate. The gaseous mixture reacts at or near the substrate surface to form a silica coating thereon.

BRIEF DESCRIPTION OF THE DRAWING

The above, as well as other advantages of the process will become readily apparent to those skilled in the art from the following detailed description when considered in the light of the accompanying drawing in which the FIGURE depicts a schematic view, in vertical section, of an installation for practicing the float glass process in accordance with certain embodiments of the invention.

DETAILED DESCRIPTION OF THE INVENTION

It is to be understood that the invention may assume various alternative orientations and step sequences, except where expressly specified to the contrary. It is also to be understood that the specific articles, apparatuses and processes described in the following specification are simply exemplary embodiments of the inventive concepts. Hence, specific dimensions, directions, or other physical characteristics relating to the embodiments disclosed are not to be considered as limiting, unless expressly stated otherwise. Also, although they may not be, like elements in the various embodiments described within this section of the application may be commonly referred to with like reference numerals.

In an embodiment of the invention, a CVD process for depositing a silica coating (hereinafter also referred to as the "CVD process") is provided.

The CVD process will be described in connection with a coated glass article. In certain embodiments, the coated glass article will be described for use in the manufacture of solar cells. It would be understood by one of ordinary skill in the art that the coated glass article could also be utilized as a superstrate or substrate in the manufacture of solar cells. Furthermore, the coated glass article described herein is not limited to solar cell applications. For example, the coated glass article may be utilized in architectural glazings, electronics, and/or have automotive and aerospace applications.

For describing certain embodiments, the silica coating may be designated by utilizing the chemical formula $SiO_2$. Preferably, the silica coating contains primarily silicon and oxygen, and possibly containing trace contaminants of, for example, carbon. More preferably, the silica coating is stoichiometric silicon dioxide. However, a silica coating which is slightly oxygen deficient may also be produced and may be useful. Thus, the silica coating may be of another suitable stoichiometry. Also, in certain embodiments, the silica coating may be doped such that it includes silicon, oxygen and fluorine.

A feature of the CVD process is that it allows for the formation of silica coatings at commercial viable deposition rates. Additionally, an advantage of the CVD process is that it is more efficient than known processes for forming a silica coating. Thus, commercially viable deposition rates can be achieved using less precursor materials than in the known processes which reduces the cost to form such coatings. For example, utilizing the CVD process, the silica coating may be formed at a dynamic deposition rate of about 150 nanometers*meter/minute (nm*m/min) or higher utilizing less silane compound than would be required in the known processes to achieve the same dynamic deposition rate. Additionally, in certain embodiments, the CVD process allows for the formation of silica coatings at deposition rates which are higher than those of known processes. For example, utilizing the CVD process, the silica coating may be formed at a dynamic deposition rate of about 175 nm*m/min or higher utilizing about the same amount of silane compound that would be utilized in a comparative process to achieve a lesser dynamic deposition rate.

The CVD process comprises providing a glass substrate. The glass substrate has a deposition surface over which the silica coating is formed.

The CVD process may be carried out in conjunction with the manufacture of the glass substrate. In an embodiment, the glass substrate may be formed utilizing the well-known float glass manufacturing process. An example of a float glass manufacturing process is illustrated in the FIGURE. In this embodiment, the glass substrate may also be referred to as a glass ribbon. However, it should be appreciated that the CVD process can be utilized apart from the float glass manufacturing process or well after formation and cutting of the glass ribbon.

In certain embodiments, the CVD process is a dynamic deposition process. In these embodiments, the glass substrate is moving at the time of forming the silica coating. Preferably, the glass substrate moves at a predetermined rate of, for example, greater than 3.175 m/min (125 in/min) as the silica coating is being formed thereon. In an embodiment, the glass substrate is moving at a rate of between 3.175 m/min (125 in/min) and 12.7 m/min (600 in/min) as the silica coating is being formed.

In certain embodiments, the glass substrate is heated. In an embodiment, the temperature of the glass substrate is about 1100° F. (593° C.) or more when the silica coating is deposited thereover or thereon. In another embodiment, the temperature of the glass substrate is between about 1100° F. (593° C.) and 1400° F. (760° C.).

Preferably, the silica coating is deposited on the deposition surface of the glass substrate while the surface is at essentially atmospheric pressure. In this embodiment, the CVD process is an atmospheric pressure CVD (APCVD) process. However, the CVD process is not limited to being an APCVD process as, in other embodiments, the silica coating may be formed under low-pressure conditions.

In an embodiment, the glass substrate is a soda-lime-silica glass. However, the CVD process is not limited to a soda-lime-silica glass substrate as, in other embodiments, the glass substrate may be a borosilicate glass. Additionally, it may be preferable to utilize a glass substrate having a low iron content in practicing the process. Thus, in certain embodiments, the CVD process is not limited to a particular substrate composition.

Further, in certain embodiments, the glass substrate is substantially transparent. However, the invention is not limited to transparent glass substrates as translucent glass substrates may also be utilized in practicing the CVD process. Also, the transparency or absorption characteristics of the substrate may vary between embodiments. Additionally, the CVD process can be practiced utilizing clear or a colored glass substrate and is not limited to a particular glass substrate thickness.

The CVD process may comprise providing a source of a silane compound, a source of oxygen, a source of a fluorine-containing compound, and a source of a radical scavenger. The CVD process may also comprise providing a source of water. Preferably, these sources are provided at a location outside the float bath chamber. Separate supply lines extend from the sources of reactant (precursor) compounds.

As used herein, the phrases "reactant compound" and "precursor compound" may be used interchangeably to refer any or all of the silane compound, oxygen, fluorine-containing compound, radical scavenger and water and/or used to describe the various embodiments thereof disclosed herein.

The CVD process also comprises forming a gaseous mixture. As would be appreciated by those skilled in the art, the precursor compounds suitable for use in the gaseous mixture should be suitable for use in a CVD process. Such compounds may at some point be a liquid or a solid but are volatile such that they can be vaporized for use in the gaseous mixture. In certain embodiments, the gaseous mixture includes precursor compounds suitable for forming the silica coating at essentially atmospheric pressure. Once in a gaseous state, the precursor compounds can be included in a gaseous stream and utilized in the CVD process to form the silica coating.

For any particular combination of gaseous precursor compounds, the optimum concentrations and flow rates for achieving a particular deposition rate and silica coating thickness may vary. However, in order to form a silica coating as is provided by the CVD process described herein, the gaseous mixture comprises the silane compound, oxygen, fluorine-containing compound and radical scavenger.

In an embodiment, the silane compound is monosilane ($SiH_4$). However, the invention is not limited to monosilane as other silane compounds are suitable for use in practicing the CVD process. For example, disilane ($Si_2H_6$) is a suitable silane compound for use in the CVD process.

In an embodiment, the fluorine-containing compound is an inorganic fluorine-containing compound. A preferred inorganic fluorine-containing compound is hydrogen fluoride (HF). Alternatively, in an embodiment, the fluorine-containing compound may be an organic fluorine-containing compound such as, for example, trifluoroacetic acid (TFA).

It has been discovered that with the addition of low concentrations of the fluorine-containing compound, higher silica coating deposition rates than with, for example, molecular oxygen alone are achieved. Thus, in an embodiment, the gaseous mixture comprises less than 4 mol % fluorine-containing compound. Preferably, the gaseous mixture comprises less than 2 mol % fluorine-containing compound. In an embodiment, the gaseous mixture comprises from about 0.04 mol to about 1.7 mol % or more of a fluorine-containing compound. In another embodiment, the gaseous mixture comprises from about 0.1 mol % to about 1.7 mol % or more of a fluorine-containing compound. In yet another embodiment, the CVD process can be further improved through the addition of about 0.2 mol % to about 1.7 mol % or more of a fluorine-containing compound to the gaseous mixture.

In an embodiment, oxygen may be provided as a part of a gaseous composition such as air. More preferably, oxygen is provided in a substantially purified form. In either embodiment, the oxygen is in the form of molecular oxygen.

In general, utilizing only a silane compound in a CVD process produces a coating of amorphous silicon on a substrate. However, silane compounds may be pyrophoric and when oxygen alone is added to a gaseous mixture comprising a pyrophoric silane compound, silica is produced. However, silica is produced at unacceptably high rates and an explosive reaction may result. Known methods of preventing such a reaction result in the deposition of coatings at very low, commercially impractical rates. Known methods are also limited in the amount of silane and oxygen which can be contained in the gaseous precursor mixture, as too high a concentration results in gas phase reaction of the elements, and no film being produced. Therefore, the gaseous mixture of the CVD process comprises a radical scavenger.

The presence of the radical scavenger allows the silane compound to be mixed with the oxygen without undergoing ignition and premature reaction at the operating temperatures. The radical scavenger further provides control of and permits optimization of the kinetics of the reaction above, near, and/or on the glass substrate. In an embodiment, the radical scavenger is a hydrocarbon gas. Preferably, the hydrocarbon gas is ethylene ($C_2H_4$) or propylene ($C_3H_6$). U.S. Pat. No. 5,798,142, which is incorporated by reference in its entirety herein, teaches the formation of a silica coating by combining a silane, oxygen, a radical scavenger and a carrier gas to form a precursor mixture.

In certain embodiments, the gaseous mixture comprises monosilane, oxygen, HF and ethylene. In one such embodiment, the gaseous mixture comprises about 0.28 mol % or more monosilane, about 1.1 mol % or more oxygen, about 0.3 mol % or more hydrogen fluoride, and about 1.7 mol % or more ethylene. In another such embodiment, the gaseous mixture comprises: about 0.58 mol % or more monosilane, 2.3 mol % or more oxygen, about 0.2 mol % or more hydrogen fluoride, and about 3.5 mol % or more ethylene.

Additionally, the gaseous mixture may comprise water ($H_2O$) in the form of water vapor or steam. In these embodiments, the concentration of water vapor in the gaseous mixture may vary to achieve a desired silica coating growth rate. However, it has been discovered that with the addition of high concentrations of water vapor higher silica coating deposition rates are achieved. Thus, in an embodiment, the gaseous mixture comprises about 40 mol % or more of water vapor. In this embodiment, the gaseous mixture may comprise: about 0.28 mol % to about 1.2 mol % monosilane, 1.2 mol % to about 4.8 mol % oxygen, about 0.2 mol % or more hydrogen fluoride, about 40 mol % or more water vapor, and about 1.7 mol % to about 3.5 mol % ethylene. Preferably, the gaseous mixture comprises 50 mol % or more of water vapor. In an embodiment, the gaseous mixture comprises about 70 mol % or more of water vapor. In this embodiment, the gaseous mixture may comprise: about 0.28 mol % to about 1.2 mol % monosilane, 1.2 mol % to about 4.8 mol % oxygen, about 0.2 mol % or more hydrogen fluoride, about 70 mol % or more water vapor, and about 1.7 mol % to about 3.5 mol % ethylene. In addition to water vapor, other inorganic oxygen-containing compounds may be utilized in practicing the CVD process such as carbon dioxide ($CO_2$), nitric oxide (NO), nitrogen dioxide ($NO_2$), and nitrous oxide ($N_2O$).

As described above, the silane compound can be mixed with oxygen without undergoing ignition and premature reaction due to the presence of the radical scavenger. The fluorine-containing compound is also mixed with the silane compound, oxygen and radical scavenger to form the gaseous mixture. Thus, in certain embodiments, the CVD process comprises mixing the precursor compounds to form the gaseous mixture. Preferably, the CVD process comprises mixing the silane compound, oxygen, radical scavenger and hydrogen fluoride to form the gaseous mixture. However, in an embodiment, the CVD process comprises mixing the silane compound, oxygen, radical scavenger, hydrogen fluoride and water vapor to form the gaseous mixture.

The gaseous mixture may also comprise one or more inert gases utilized as camel or diluent gas. Suitable inert gases include nitrogen ($N_2$), helium (He) and mixtures thereof. Thus, the CVD process may comprise providing a source of the one or more inert gases from which separate supply lines may extend.

In certain embodiments, the gaseous mixture is fed through a coating apparatus prior to forming the silica coating and discharged from the coating apparatus utilizing one or more gas distributor beams. Preferably, the gaseous mixture is formed prior to being fed through the coating apparatus. For example, the precursor compounds may be mixed in a feed line connected to an inlet of the coating apparatus. In other embodiments, the gaseous mixture may be formed within the coating apparatus.

The gaseous mixture is directed toward and along the glass substrate. Utilizing a coating apparatus aids in directing the gaseous mixture toward and along the glass substrate. Preferably, the gaseous mixture is directed toward and along the glass substrate in a laminar flow.

Depending on the thickness of the silica coating required, the silica coating formed by the CVD process may be deposited by forming a plurality of silica coating layers consecutively. However, due to the improvements offered by the CVD process, only a single coating apparatus may be required for forming the silica coating depending on the desired thickness. Preferably, the coating apparatus extends transversely across the glass substrate and is provided at a predetermined distance thereabove. The coating apparatus is preferably located at, at least, one predetermined location. When the CVD process is utilized in conjunction with the float glass manufacturing process, the coating apparatus is preferably provided within the float bath section thereof. However, the coating apparatus may be provided in the annealing lehr, and/or in the gap between the float bath and the annealing lehr.

Descriptions of coating apparatuses suitable for being utilized in the CVD process can be found in U.S. patent application Ser. No. 13/426,697 and U.S. Pat. No. 4,922,853, the entire disclosures of which are hereby incorporated by reference. Another advantage of the CVD process described herein is the significant reduction in the amount of pre-reaction/powder formation that occurs on and/or in a coating apparatus when utilized. Hence, the CVD process can be operated for run lengths which are much greater than those of conventional processes.

The gaseous mixture reacts at or near the deposition surface to form the silica coating thereon. The CVD process results in the deposition of a high quality silica coating on the glass substrate. In particular, the silica coating formed using the CVD process exhibits excellent coating thickness uniformity. In an embodiment, the silica coating is a pyrolytic coating.

In an embodiment, the silica coating is formed directly on the glass substrate. In other embodiments, the silica coating is formed over one or more previously deposited coating layer. In one such embodiment, the silica coating is formed directly on a tin oxide coating. In this embodiment, the tin oxide coating has been previously deposited over the deposition surface of the glass substrate. Thus, the tin oxide coating, over which the silica coating is to be deposited, may be deposited directly on the glass substrate.

For describing certain embodiments, the tin oxide coating may be designated by utilizing the chemical formula $SnO_2$. Preferably, the tin oxide coating contains primarily tin and oxygen, and possibly containing trace contaminants. More preferably, the tin oxide coating is stoichiometric tin oxide. However, a tin oxide coating which is slightly oxygen deficient may also be produced and may be useful. Thus, the tin oxide coating may be of another suitable stoichiometry. Also, in certain embodiments, the tin oxide coating may be doped such that it includes tin, oxygen and fluorine.

The tin oxide coating may be formed shortly before forming the silica coating. In an embodiment, the tin oxide coating may be formed in conjunction with the float glass manufacturing process. In this embodiment, the deposition of the tin oxide coating preferably takes place in the float bath section. However, it should be appreciated that the tin oxide coating may be formed utilizing another manufacturing process. When the tin oxide coating is formed in conjunction with the float glass manufacturing process, the tin oxide coating may be formed by CVD, utilizing a coating apparatus and/or at essentially atmospheric pressure. However, as should be appreciated, the tin oxide coating may be formed utilizing another deposition process, under low-pressure conditions, and without the use of a coating apparatus.

In an embodiment, the tin oxide coating is a pyrolytic coating. In another embodiment, the tin oxide coating is an undoped coating. In either of these embodiments, the tin oxide coating may be formed using halogen containing tin precursor compound, preferably a Cl-containing precursor compound. Preferred Cl-containing precursor compounds for use in forming the tin oxide coating are dimethyltin dichloride (DMT), tin tetrachloride ($SnCl_4$) and monobutyltin trichloride (MBTC).

In an embodiment, the tin oxide coating has been deposited directly on the glass substrate at a thickness between 5 nm and 100 nm. Preferably, in this embodiment, the tin oxide coating has been deposited at a thickness of about 21-25 nm. Thus, in the embodiments where a tin oxide coating has been deposited prior to forming the silica coating, at least two discrete coating layers are deposited on the glass substrate.

In another embodiment, the tin oxide coating is formed on a previously deposited silica coating (hereinafter referred to as "first silica coating"). The first silica coating may be formed shortly before forming the tin oxide coating. In an embodiment, the first silica coating may be formed in conjunction with the float glass manufacturing process. In this embodiment, deposition of the first silica coating preferably takes place in the float bath section. However, it should be appreciated that the first silica coating may be formed utilizing another manufacturing process.

When the first silica coating is formed in conjunction with the float glass manufacturing process, the first silica coating may be formed by CVD, utilizing a coating apparatus and/or at essentially atmospheric pressure. However, as should be appreciated, the first silica coating may be formed utilizing another deposition process, under low-pressure conditions, and without the use of a coating apparatus. The first silica coating may be deposited according to the CVD process described herein. Alternatively, the first silica coating may also be deposited in accordance with the method disclosed in U.S. Pat. No. 5,798,142.

For describing certain embodiments, the first silica coating may be designated by utilizing the chemical formula $SiO_2$. Preferably, the first silica coating contains primarily silicon and oxygen, and possibly containing trace contaminants of, for example, carbon. More preferably, the first silica coating is stoichiometric silicon dioxide. However, a silica coating which is slightly oxygen deficient may also be produced and may be useful. Thus, the first silica coating may be of another suitable stoichiometry. Also, in certain embodiments, the first silica coating may be doped such that it includes silicon, oxygen and a dopant material such as, for example, fluorine.

In an embodiment, first silica coating is deposited directly on the glass substrate at a thickness between 5 nm and 30 nm. Preferably, the first silica coating is deposited at a thickness of about 15 nm. In these embodiments, the first silica coating acts as a sodium diffusion barrier.

As discussed above, the coated glass articles resulting from utilizing the CVD process may be of a glass/silica, glass/tin oxide/silica or glass/silica/tin oxide/silica arrangement. However, the CVD process described herein may be utilized in combination with one or more additional coating layers to achieve a desired coating stack. The additional coating layer(s) may be formed in conjunction with the float glass manufacturing process shortly after forming the silica coating or as part of another manufacturing process. Also, these additional coating layers may be formed by pyrolysis or by another coating deposition process, and/or by utilizing one or more additional coating apparatuses.

As an example, additional coating layer(s) of thin-film photovoltaic materials, or other semiconductor materials, may be formed over the silica coating layer so as to provide a desired coating stack. The photovoltaic materials, or other semiconductor materials, may be formed over the coated glass article during the manufacturing of solar cells. Additionally, coating layer(s) may be deposited over the silica coating so as to provide a coating stack, and therefore coated glass articles, with high conductivity, low emissivity and/or anti-reflective properties.

In an embodiment, these additional coating layers may be transparent conductive metal oxides (TCOs). Examples of such TCOs are fluorine doped tin oxide ($SnO_2$:F) and aluminum doped zinc oxide (ZnO:Al). However, the additional coating layer(s) need not be doped in order to achieve a desired coating stack as transparent metal oxide coating layers of tin oxide, additional layers of silica, iron oxide ($Fe_2O_3$), and titanium dioxide ($TiO_2$) may be formed over the silica coating.

These additional coating layer(s) may be formed shortly before or shortly after forming the silica coating. In an embodiment, the additional coating layer(s) are formed in conjunction with the float glass manufacturing process. When these coating layers are formed in conjunction with the float glass manufacturing process, an APCVD process may be utilized. However, as should be appreciated, other processes known to those skilled in the art may be utilized.

As discussed, above, the CVD process may be carried out in conjunction with the manufacture of the glass substrate in the well-known float glass manufacturing process. The float glass manufacturing process is typically carried out utilizing a float glass installation such as the installation 10 depicted in the FIGURE. However, it should be understood that the float glass installation 10 described herein is only illustrative of such installations.

As illustrated in the FIGURE, the float glass installation 10 may comprise a canal section 20 along which molten glass 19 is delivered from a melting furnace, to a float bath section 11 wherein the glass substrate is formed. In this embodiment, the glass substrate will be referred to as a glass ribbon 8. The glass ribbon 8 is a preferable substrate on which the silica coating is deposited. However, it should be appreciated that the glass substrate is not limited to being a glass ribbon.

The glass ribbon 8 advances from the bath section 11 through an adjacent annealing lehr 12 and a cooling section 13. The float bath section 11 includes: a bottom section 14 within which a bath of molten tin 15 is contained, a roof 16, opposite side walls (not depicted) and end walls 17. The roof 16, side walls and end walls 17 together define an enclosure 18 in which a non-oxidizing atmosphere is maintained to prevent oxidation of the molten tin 15.

In operation, the molten glass 19 flows along the canal 20 beneath a regulating tweel 21 and downwardly onto the surface of the tin bath 15 in controlled amounts. On the molten tin surface, the molten glass 19 spreads laterally under the influence of gravity and surface tension, as well as certain mechanical influences, and it is advanced across the tin bath 15 to form the glass ribbon 8. The glass ribbon 8 is removed from the bath section 11 over lift out rolls 22 and is thereafter conveyed through the annealing lehr 12 and the cooling section 13 on aligned rolls. The deposition of the silica coating preferably takes place in the float bath section 11, although it may be possible for deposition to take place further along the glass production line, for example, in the gap 28 between the float bath 11 and the annealing lehr 12, or in the annealing lehr 12.

As illustrated in the FIGURE, four coating apparatuses 9, 9A, 9B, 9C are shown within the float bath section 11. The silica coating formed by the CVD process may be deposited by forming a plurality of silica coating layers consecutively. Thus, depending on the thickness of the silica coating desired, the silica coating may be formed utilizing one or more of the coating apparatuses 9, 9A, 9B, 9C with the remaining coating apparatuses may be utilized to form the first silica coating, the tin oxide coating and/or an additional coating layer(s) if desired. For example, in an embodiment, a tin oxide coating is formed utilizing a coating apparatus 9A, the silica coating may be formed utilizing an adjacent apparatus 9 and the remaining coating apparatuses 9B, 9C may be utilized to form a fluorine doped tin oxide coating. In another embodiment, a first silica coating may be formed utilizing a coating apparatus 9A, a tin oxide coating may be formed utilizing an adjacent apparatus 9, the silica coating may be formed utilizing a coating apparatus 9B and a fluorine doped tin oxide coating may be formed utilizing a coating apparatuses 9C and one or more additional coating apparatuses (not depicted).

A suitable non-oxidizing atmosphere, generally nitrogen or a mixture of nitrogen and hydrogen in which nitrogen predominates, is maintained in the float bath section 11 to prevent oxidation of the molten tin 15 comprising the float bath. The atmosphere gas is admitted through conduits 23 operably coupled to a distribution manifold 24. The non-oxidizing gas is introduced at a rate sufficient to compensate for normal losses and maintain a slight positive pressure, on the order of between about 0.001 and about 0.01 atmosphere above ambient atmospheric pressure, so as to prevent infiltration of outside atmosphere. For purposes of the describing the invention, the above-noted pressure range is considered to constitute normal atmospheric pressure.

The silica coating is preferably formed at essentially atmospheric pressure. Thus, the pressure of the float bath section 11, annealing lehr 12, and/or in the gap 28 between the float bath 11 and the annealing lehr 12 may be essentially atmospheric pressure.

Heat for maintaining the desired temperature regime in the float bath section 11 and the enclosure 18 is provided by radiant heaters 25 within the enclosure 18. The atmosphere within the lehr 12 is typically atmospheric air, as the cooling section 13 is not enclosed and the glass ribbon 8 is therefore open to the ambient atmosphere. The glass ribbon 8 is subsequently allowed to cool to ambient temperature. To cool the glass ribbon 8, ambient air may be directed against the glass ribbon 8 as by fans 26 in the cooling section 13. Heaters (not depicted) may also be provided within the annealing lehr 12 for causing the temperature of the glass ribbon 8 to be gradually reduced in accordance with a predetermined regime as it is conveyed therethrough.

EXAMPLES

In TABLES 1, 2, 3 and 4 the columns listing the properties of the silica coatings formed by the silica deposition processes are designated with an $SiO_2$.

In TABLE 1 and TABLE 2, examples within the scope of the invention are Ex 1-Ex 8. However, Ex 1-Ex 8 are for illustrative purposes only and are not to be construed as a limitation on the invention. Comparative examples, not considered to be a part of the invention, are designated as C1 and C2.

The following experimental conditions are applicable to C1, C2, and Ex 1-Ex 8.

The coated glass articles of C1, C2, and Ex 1-Ex 8 are of a glass/$SnO_2$/silica/$SnO_2$:F arrangement. The coated layers above-described were deposited on a soda-lime-silica glass substrate. The glass substrate was moving at the time the coating layers were deposited thereon in conjunction with the float glass manufacturing process. For C1, C2, and Ex 1-Ex 8, prior to forming the silica coating, a pyrolytic $SnO_2$ coating was deposited at a thickness of between about 21-25 nm over the glass ribbon. After forming the silica coating, a pyrolytic $SnO_2$:F coating was deposited at a thickness of between about 310-330 nm over the silica coating.

For forming the silica coating, the total gas flow of all constituents of the gaseous mixture was 166 liters per minute per meter of gas distributor beam perpendicular to glass ribbon travel (l/min/m) for the examples listed in TABLE 1. Total gas flow of all constituents of the gaseous mixture was between 162 and 163 l/min/m for the examples listed in TABLE 2. The amounts of the individual gaseous precursor compounds are as listed in TABLES 1 and 2. The gaseous mixtures also comprised inert gases which made up the balance of the gaseous mixture. Line speeds, i.e. the speed of the glass substrate moving beneath the coating apparatus from which the gaseous precursor compounds were delivered, were 5.94 m/min. and 10.5 m/min, respectively.

In TABLE 3, examples within the scope of the invention are Ex 9-Ex 15. However, Ex 9-Ex 15 are for illustrative purposes only and are not to be construed as a limitation on the invention. A comparative example, not considered to be a part of the invention, is designated as C3.

The following experimental conditions are applicable to C3 and Ex 9-Ex 15.

The coated glass articles of C3 and Ex 9-Ex 15 are of a glass/silica/$SnO_2$/silica/$SnO_2$:F arrangement. The conditions and properties reported in TABLE 3 are directed to the silica coating which was formed over the $SnO_2$ coating. The coating layers above-described were deposited on a soda-lime-silica glass substrate. The glass substrate was moving at the time the coating layers were deposited thereon in conjunction with the float glass manufacturing process. For C3 and Ex 9-Ex 15, a pyrolytic first silica coating was deposited utilizing the process described in U.S. Pat. No. 5,798,142 at a thickness of about 15 nm on the glass substrate. Next, a pyrolytic $SnO_2$ coating was deposited over the first silica coating. Next, a silica coating was formed over the $SnO_2$ coating. After forming the silica coating, a pyrolytic $SnO_2$:F coating was deposited over the silica coating.

For forming the silica coating of C3 and Ex 9-Ex 15, the total gas flow of all constituents of the gaseous mixture was 176.5 l/min/m. The amounts of the individual gaseous precursor compounds for C3 and Ex 9-Ex 15 are as listed in TABLE 3. The gaseous mixtures also comprised inert gases which made up the balance of the gaseous mixture. The line speed for of the examples reported in TABLE 3 was 14.5 m/min.

In TABLE 4, examples within the scope of the invention are Ex 16 and Ex 17. However, Ex 16 and Ex 17 are for illustrative purposes only and are not to be construed as a limitation on the invention. A comparative example, not considered to be a part of the invention, is designated as C4.

The following experimental conditions are applicable to C4 and Ex 16-Ex 17.

The coated glass articles of C4 and Ex 16-Ex 17 are of a glass/silica/$SnO_2$:F arrangement. The above-described coating layers were deposited on a soda-lime-silica glass substrate. The glass substrate was moving at the time the coating layers were deposited thereon in conjunction with the float glass manufacturing process. For C4 and Ex 16-Ex 17, a silica coating was formed directly on the glass substrate. After forming the silica coating, a pyrolytic $SnO_2$:F coating was deposited over the silica coating.

For forming the silica coating of C4 the total gas flow of all constituents of the gaseous mixture was 165.8 l/min/m. For forming the silica coating of Ex 16 the total gas flow of all constituents of the gaseous mixture was 165.8 l/min/m. For forming the silica coating of Ex 17 the total gas flow of all constituents of the gaseous mixture was 175.6 l/min/m. The amounts of the individual gaseous precursor compounds for C4 and Ex 16-Ex 17 are as listed in TABLE 4. The gaseous mixtures also comprised inert gases which made up the balance of the gas mixture. The line speed for of the examples reported in TABLE 4 was 10.5 m/min.

Deposition rates for purposes of this application are expressed in two ways:

(1) Dynamic Deposition Rate (DDR) which equals thickness of the silica coating in nm multiplied by the line speed in m/min. and is expressed as nm*m/min. DDR is useful for comparing coating deposition rates at different line speeds.

(2) Concentration Adjusted—Dynamic Deposition Rate (CA-DDR) equals the DDR divided by the concentration of silane (% $SiH_4$) available in the precursor mixture. The CA-DDR is expressed as (nm*m/min)/% $SiH_4$ and is useful for comparing deposition rates, in this case of silica coatings, having different precursor concentrations at different line speeds.

The silica coating thicknesses reported in TABLES 1, 2, 3 and 4 were calculated using reflection. Also, for the examples where it is reported, % Improvement is a comparison of the CA-DDRs of the known processes (C1, C2, C3, C4) and of the CA-DDRs of certain embodiments of the presently described CVD process and is expressed as a percentage.

TABLE 1

Line Speed - 5.94 m/min

| Examples Comp. Ex | Total Flow l/min/m | % $SiH_4$ | % $O_2$ | % $C_2H_4$ | % HF | Thickness $SiO_2$ (nm) | DDR $SiO_2$ nm * m/min | CA-DDR $SiO_2$ (nm * (m/min))/% $SiH_4$ | % Improvement |
|---|---|---|---|---|---|---|---|---|---|
| C1   | 166 | 0.28 | 1.1 | 1.7 | 0.0 | 25.6 | 152 | 54735 | — |
| Ex 1 | 166 | 0.28 | 1.1 | 1.7 | 0.3 | 38.0 | 226 | 81247 | 48.4 |
| Ex 2 | 166 | 0.28 | 1.1 | 1.7 | 0.8 | 29.7 | 176 | 63501 | 16.0 |
| Ex 3 | 166 | 0.28 | 1.1 | 1.7 | 1.6 | N/A  | N/A | N/A   | N/A |

TABLE 2

Line Speed - 10.5 m/min

| Examples Comp. Ex | Total Flow l/min/m | % $SiH_4$ | % $O_2$ | % $C_2H_4$ | % $H_2O$ | % HF | Thickness $SiO_2$ (nm) | DDR $SiO_2$ nm * m/min | CA-DDR $SiO_2$ (nm * (m/min))/% $SiH_4$ | % Improvement |
|---|---|---|---|---|---|---|---|---|---|---|
| C2   | 166 | 0.57 | 2.3 | 3.4 | 0.0  | 0.0 | 25.1 | 262 | 45840 | — |
| Ex 4 | 163 | 0.58 | 2.3 | 3.5 | 0.0  | 0.1 | 37.0 | 386 | 66490 | 45.0 |
| Ex 5 | 163 | 0.58 | 2.3 | 3.5 | 0.0  | 0.2 | 40.7 | 426 | 73179 | 60.0 |
| Ex 6 | 162 | 0.58 | 2.3 | 3.5 | 0.0  | 0.3 | 38.2 | 399 | 68573 | 50.0 |
| Ex 7 | 162 | 0.58 | 2.3 | 3.5 | 0.0  | 0.6 | 38.8 | 406 | 69424 | 51.0 |
| Ex 8 | 163 | 0.58 | 2.3 | 3.5 | 80.3 | 0.3 | 45.0 | 471 | 80779 | 76.2 |

TABLE 3

Line Speed - 14.5 m/min

| Examples Comp. Ex | Total Flow l/min/m | % $SiH_4$ | % $O_2$ | % $C_2H_4$ | % $H_2O$ | % HF | Thickness $SiO_2$ (nm) | DDR $SiO_2$ nm * m/min | CA-DDR $SiO_2$ (nm * (m/min))/% $SiH_4$ | % Improvement |
|---|---|---|---|---|---|---|---|---|---|---|
| C3    | 176.5 | 1.2 | 7.0 | 8.4 | 0.0  | 0.0  | 20.3 | 293 | 25151 | — |
| EX 9  | 176.5 | 1.2 | 7.0 | 8.4 | 0.0  | 0.5  | 21.5 | 311 | 26637 | 6 |
| Ex 10 | 176.5 | 1.2 | 7.0 | 8.4 | 0.0  | 1.00 | 23.9 | 345 | 29611 | 17.7 |
| Ex 11 | 176.5 | 1.2 | 7.0 | 8.4 | 0.0  | 1.50 | 23.9 | 345 | 29611 | 17.7 |
| Ex 12 | 176.5 | 1.2 | 7.0 | 8.4 | 0.0  | 1.67 | 24.3 | 351 | 30106 | 19.7 |
| Ex 13 | 176.5 | 1.3 | 8.0 | 9.6 | 0.0  | 1.67 | 25.1 | 363 | 27210 | 8.2 |
| Ex 14 | 176.5 | 1.2 | 7.0 | 8.4 | 39.3 | 1.67 | 12.3 | 178 | 15239 | N/A |
| Ex 15 | 176.5 | 1.2 | 7.0 | 8.4 | 39.3 | 0.5  | 15.2 | 220 | 18832 | N/A |

TABLE 4

Line Speed - 10.5 m/min

| Examples Comp. Ex | Total Flow l/min/m | % $SiH_4$ | % $O_2$ | % $C_2H_4$ | % $H_2O$ | % HF | Thickness $SiO_2$ (nm) | DDR $SiO_2$ nm * m/min | CA-DDR $SiO_2$ (nm * (m/min))/% $SiH_4$ | % Improvement |
|---|---|---|---|---|---|---|---|---|---|---|
| C4    | 165.8 | 1.14 | 4.57 | 6.86 | 0.0  | 0.0  | 38 | 397.4 | 34769 | — |
| EX 16 | 165.8 | 1.14 | 4.57 | 6.86 | 0.0  | 0.32 | 84 | 882   | 77175 | 122 |
| EX 17 | 175.6 | 1.08 | 4.32 | 6.47 | 74.3 | 0.30 | 84 | 882   | 81732 | 135 |

It should be noted for Ex 3 that a silica coating was formed under the conditions reported in TABLE 1. However, the uniformity of the silica coating varied across the glass substrate such that over certain portions of the substrate a silica coating was deposited at a higher rate than that of C1 and over other portions of the substrate a silica coating was deposited at a similar or lesser rate than that of C1. It is not believed that the experimental conditions of Ex 3 were causal to the deposition rate differences over the surface of the glass substrate. Thus, the reported conditions of Ex 3 should not be viewed as limiting the CVD process.

As shown by Ex 1-Ex 17, the CVD process provides an improved process over comparative silica deposition processes as illustrated by C1, C2, C3 and C4. For example, the silica coating thickness for comparative silica deposition process C2 was 25.1 nm. However, for ex 4 and ex 5, the silica film thickness was 37.0 nm and 40.7 nm, respectively. Also, as shown by the silica deposition rates of Ex 1 and Ex 2 and comparative silica deposition process C1, when the mol % s for $SiH_4$ are equal in the gaseous precursor mixture, the silica deposition rate provided by the process described herein is greater than that of the comparative deposition process.

As can be observed from Ex 1 and Ex 2 and Ex 4 and Ex 5 in TABLES 1 and 2, when the mol % ratio of $SiH_4$ to $O_2$ and $C_2H_4$ is kept relatively equal, for example, at a 1-4-6 ratio, the addition of HF in the gaseous precursor mixture generally results in increases in the silica coating thickness and improvement in the silica deposition rate. In Ex 8, the effect on silica deposition rate of utilizing a fluorine-containing compound and water vapor in the gaseous mixture can be observed. As illustrated in this embodiment, when water vapor is utilized with a fluorine-containing compound such as, for example, HF in the gaseous mixture the deposition rate of the silica coating further increases.

Ex 9-Ex 15 illustrate that the CVD process can be utilized to form a silica coating at an improved deposition rate over two or more previously deposited coating layers.

Ex 16 and Ex 17 illustrate that the CVD process can be utilized to form a silica coating directly on the deposition surface of a moving glass substrate at an improved deposition rate. As illustrated, by the CA-DDR of Ex 16 and Ex 17, an improvement of greater than 100% is possible with certain embodiments of the CVD process.

Thus, the CVD process described herein provides a more efficient deposition process which produces a better silica deposition rate than the comparative deposition processes.

The foregoing description is considered as illustrative only of the principles of the invention. Further, since numerous modifications and changes will readily occur to those skilled in the art, it is not desired to limit the invention to the exact construction and processes shown and described herein. Accordingly, all suitable modifications and equivalents may be considered as falling within the scope of the invention as defined by the claims which follow.

What is claimed is:

1. A chemical vapor deposition process for depositing a silica coating, comprising:
   providing a float glass ribbon in a float glass manufacturing process;
   forming a gaseous mixture comprising a silane compound, oxygen, a fluorine-containing compound, and a radical scavenger; and
   directing the gaseous mixture toward and along the float glass ribbon, and reacting the mixture over the float glass ribbon to form the silica coating thereon, wherein the silica coating is undoped.

2. The chemical vapor deposition process defined in claim 1, wherein the gaseous mixture also comprises water vapor.

3. The chemical vapor deposition process defined in claim 2, wherein the gaseous mixture comprises less than 4 mol % fluorine-containing compound.

4. The chemical vapor deposition process defined in claim 1, wherein the float glass ribbon is moving.

5. The chemical vapor deposition process defined in claim 4, wherein the silica coating is formed at a deposition rate of about 175 nm*m/min. or higher.

6. The chemical vapor deposition process defined in claim 4, wherein the float glass ribbon is moving at a rate of 3.175 m/min or more.

7. The chemical vapor deposition process defined in claim 1, wherein the silica coating is formed on a deposition surface of the float glass ribbon which is at essentially atmospheric pressure.

8. The chemical vapor deposition process defined in claim 1, wherein the fluorine-containing compound is an inorganic fluorine-containing compound.

9. The chemical vapor deposition process defined in claim 8, wherein the fluorine-containing compound is hydrogen fluoride.

10. The chemical vapor deposition process defined in claim 1, wherein the fluorine-containing compound is an organic fluorine-containing compound.

11. The chemical vapor deposition process defined in claim 1, wherein the gaseous mixture is formed prior to being fed to a coating apparatus.

12. The chemical vapor deposition process defined in claim 1, wherein the silica coating is formed directly on the float glass ribbon.

13. The chemical vapor deposition process defined in claim 1, wherein the silica coating is formed over a tin oxide coating.

14. The chemical vapor deposition process defined in claim 1, wherein the silane compound is monosilane.

15. The chemical vapor deposition process defined in claim 1, wherein the float glass ribbon is at a temperature of between about 1100° F. (593° C.) and 1400° F. (760° C.) when the silica coating is deposited thereon.

16. The chemical vapor deposition process defined in claim 1, wherein the fluorine-containing compound is hydrogen fluoride and the gaseous mixture comprises 0.04 mol %-4 mol % hydrogen fluoride.

17. A chemical vapor deposition process for depositing a coating of silica, comprising:
    providing a glass substrate;
    forming a gaseous mixture comprising: a silane compound, oxygen, hydrogen fluoride, and a radical scavenger; and
    directing the gaseous mixture toward and along the glass substrate, and reacting the mixture over the glass substrate to form the silica coating thereon, wherein the silica coating is undoped.

18. The chemical vapor deposition process defined in claim 17, wherein the gaseous mixture is formed prior to being fed through a coating apparatus.

19. A chemical vapor deposition process for depositing a silica coating comprising the steps of:
    providing a moving glass substrate having a surface upon which the silica coating is to be deposited over at essentially atmospheric pressure;
    mixing a silane compound, oxygen, hydrogen fluoride and a radical scavenger to form a gaseous mixture;
    feeding the gaseous mixture through a coating apparatus; and discharging the gaseous mixture from the coating apparatus and directing the gaseous mixture toward and along the surface of the glass substrate, and reacting the mixture at or near the substrate surface to form a silica coating thereon, wherein the silica coating is undoped.

20. The chemical vapor deposition process defined in claim 19, wherein the gaseous mixture is formed prior to being fed through the coating apparatus.

21. The chemical vapor deposition process defined in claim 19, wherein the glass substrate is between about 1100° F. (593° C.) and 1400° F. (760° C.) when the silica coating is deposited thereon.

* * * * *